United States Patent
Vollkommer et al.

(10) Patent No.: US 11,658,661 B2
(45) Date of Patent: May 23, 2023

(54) PUSH BUTTON SWITCH ASSEMBLY FOR A VEHICLE

(71) Applicant: Arens Controls Company, L.L.C., Arlington Heights, IL (US)

(72) Inventors: Roy F. Vollkommer, Arlington Heights, IL (US); Andrew A. Vogel, Arlington Heights, IL (US)

(73) Assignee: ARENS CONTROLS COMPANY, LLC, Arlington Heights, IL (US)

( * ) Notice: Subject to any disclaimer, the term of this patent is extended or adjusted under 35 U.S.C. 154(b) by 0 days.

(21) Appl. No.: 17/811,992

(22) Filed: Jul. 12, 2022

(65) Prior Publication Data

US 2022/0345130 A1    Oct. 27, 2022

Related U.S. Application Data

(62) Division of application No. 16/391,404, filed on Apr. 23, 2019, now Pat. No. 11,418,192.

(51) Int. Cl.
*H03K 17/97* (2006.01)
*F16H 59/12* (2006.01)
*F16H 61/24* (2006.01)

(52) U.S. Cl.
CPC .............. *H03K 17/97* (2013.01); *F16H 59/12* (2013.01); *F16H 61/24* (2013.01); *F16H 2061/241* (2013.01); *H03K 2017/9713* (2013.01); *H03K 2217/9651* (2013.01)

(58) Field of Classification Search
CPC ........... H03K 17/97; H03K 2017/9713; H03K 2217/9651; F16H 59/12; F16H 2061/241; F16H 61/24
See application file for complete search history.

(56) References Cited

U.S. PATENT DOCUMENTS

| | | |
|---|---|---|
| 4,054,944 A | 10/1977 | Lau |
| 5,977,888 A | 11/1999 | Fujita et al. |
| 9,318,280 B2 | 4/2016 | Bachmann |
| 9,324,515 B2 | 4/2016 | Krumpelman et al. |
| 2005/0035836 A1 | 2/2005 | Howard et al. |
| 2006/0181517 A1 | 8/2006 | Zadesky et al. |
| 2016/0172136 A1 | 6/2016 | McGaffey et al. |
| 2017/0154744 A1 | 6/2017 | Hanson |
| 2019/0080549 A1 | 3/2019 | Lewis et al. |
| 2021/0118632 A1 | 4/2021 | Vollkommer et al. |

*Primary Examiner* — Bernard Rojas
(74) *Attorney, Agent, or Firm* — Pearne & Gordon LLP (57) ABSTRACT

A push button switch assembly for a vehicle includes an elastic button that is moveable between a first unactuated position and a second actuated position. An actuator is disposed adjacent a plate and is pivotable between a first position and a second position. The actuator includes a magnetic element. When the elastic button is in the first unactuated position the magnetic element biases the actuator into the first position, and when the elastic button is moved to the second actuated position, a force applied to the elastic button is transmitted to the actuator such that the force overcomes the magnetic attraction and permits the actuator to pivot to the second position while providing a tactile haptic response. When the actuator is moved to the second position, a hall sensor senses a change in the magnetic field of the magnetic element.

16 Claims, 8 Drawing Sheets

PUSH BUTTON SWITCH ASSEMBLY FOR A VEHICLE

CROSS-REFERENCE TO RELATED APPLICATIONS

This application is a divisional of U.S. application Ser. No. 16/391,404, filed on Apr. 23, 2019. This application is incorporated herein by reference.

FIELD OF THE INVENTION

This application relates generally to a push button switch assembly, and more particularly, to a push button switch assembly for a vehicle.

BACKGROUND OF THE INVENTION

Conventional means for selecting an operating mode of a vehicle include gear shifts which require a user to manually translate the entire gear shift from one location to another location in order to change the operating mode. Alternatively, switch assemblies may be used to select an operating mode of the vehicle. This greatly reduces the amount of time and energy necessary to operate the vehicle. Traditional switch assemblies include springs to bias a button of the switch assembly into an unactuated position. After the button has been actuated (i.e., depressed), the biasing force of the spring returns the button to the unactuated position. Over time, the biasing force of the spring deteriorates due to overuse of the spring. Moreover, the spring is incapable of providing sufficient feedback (to the user) that the button has been correctly actuated, such that the operating mode associated with that button will commence.

BRIEF SUMMARY OF THE INVENTION

In accordance with one aspect, there is provided a push button switch assembly for a vehicle. The push button switch assembly includes an elastic button moveable between a first unactuated position and a second actuated position. The push button switch assembly further includes a plate. An actuator is disposed adjacent the plate and is pivotable between a first position and a second position. The actuator includes a magnetic element wherein when the actuator is in the first position the magnetic element is closer to the plate than when the actuator is in the second position. The push button switch assembly further includes a hall sensor configured to sense a magnetic field of the magnetic element. When the elastic button is in the first unactuated position the magnetic element biases the actuator into the first position via a magnetic attraction between the magnetic element and the plate. When the elastic button is moved to the second actuated position, a force applied to the elastic button is transmitted to the actuator such that said force overcomes the magnetic attraction and permits the actuator to pivot to the second position while providing a tactile haptic response. Further, when the actuator is moved to the second position, the hall sensor senses a change in the magnetic field of the magnetic element.

In accordance with another aspect, there is provided a push button switch assembly for a vehicle. The push button switch assembly includes an actuator that is pivotable between a first position and a second position. The actuator includes a magnetic element. A metallic element is positioned adjacent the actuator. The actuator is biased into the first position via a magnetic attraction between the magnetic element and the metallic element. When the actuator is in the first position the magnetic element is closer to the metallic element than when the actuator is in the second position. The push button switch assembly further includes a hall sensor configured to sense a magnetic field of the magnetic element. When a force applied to the actuator meets or exceeds an initial, maximum force of the magnetic attraction, the actuator pivots towards the second position and provides a tactile haptic response. Further, when the actuator pivots towards the second position, the hall sensor senses a change in the magnetic field of the magnetic element.

DESCRIPTION OF EXAMPLE EMBODIMENTS

Figure 1:
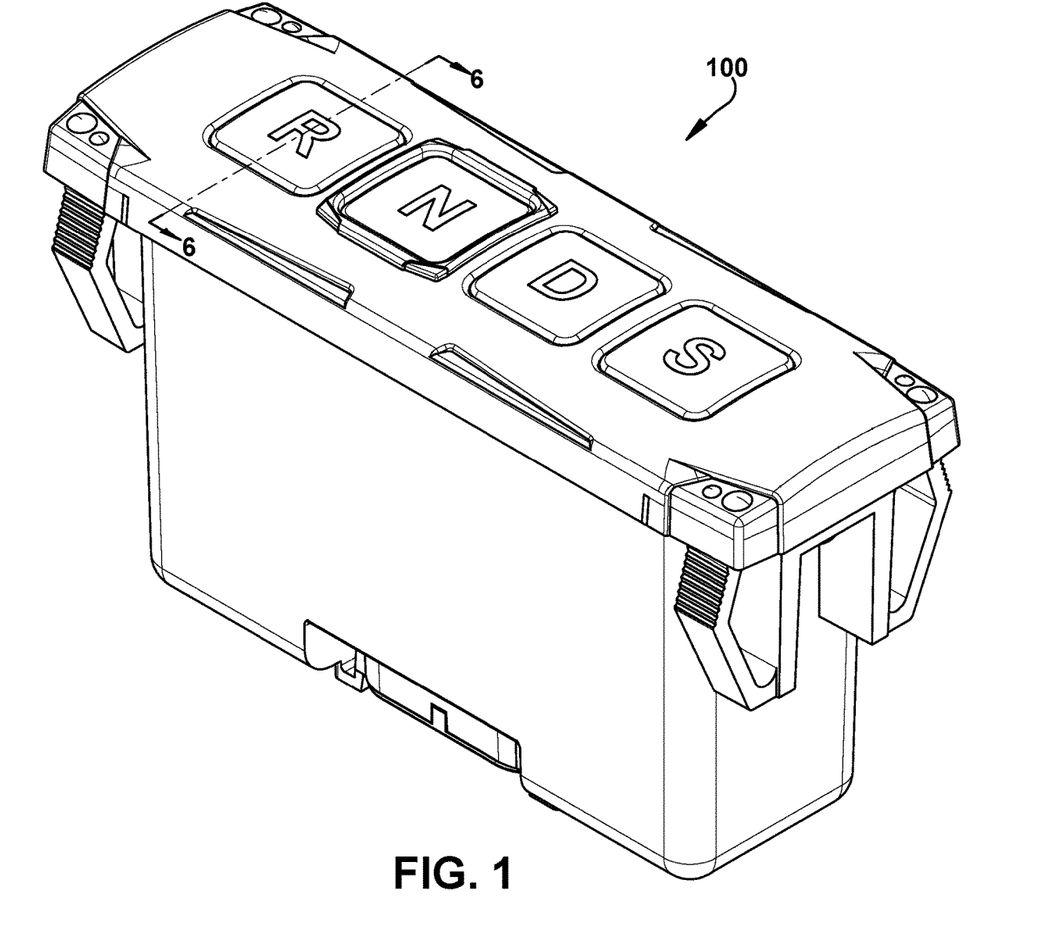
FIG. 1 is a perspective view of a push button switch assembly, according to the present invention.

Referring now to the drawings, FIG. 1 depicts a perspective view of a push button switch assembly 100. Specifically, the push button switch assembly 100 is to be employed in a vehicle (i.e., a means of transportation). The push button switch assembly 100 may be employed in vehicles such as: motor vehicles (e.g., cars, trucks, buses, motorcycles, tricycles, etc.); railed vehicles (e.g., trains, trams, etc.); watercrafts (e.g., ships, boats, Jet Skis©, wave-runners, etc.); amphibious vehicles (e.g., airboats, hovercrafts, etc.); aircrafts (e.g., airplanes, helicopters, etc.); and spacecrafts. It is to be understood that the push button switch assembly 100 may be employed in vehicles other than those that are specifically configured for transportation. That is, the push button switch assembly 100 may also be employed in industrial vehicles (e.g., excavating equipment, loaders, etc.).

Figure 2:
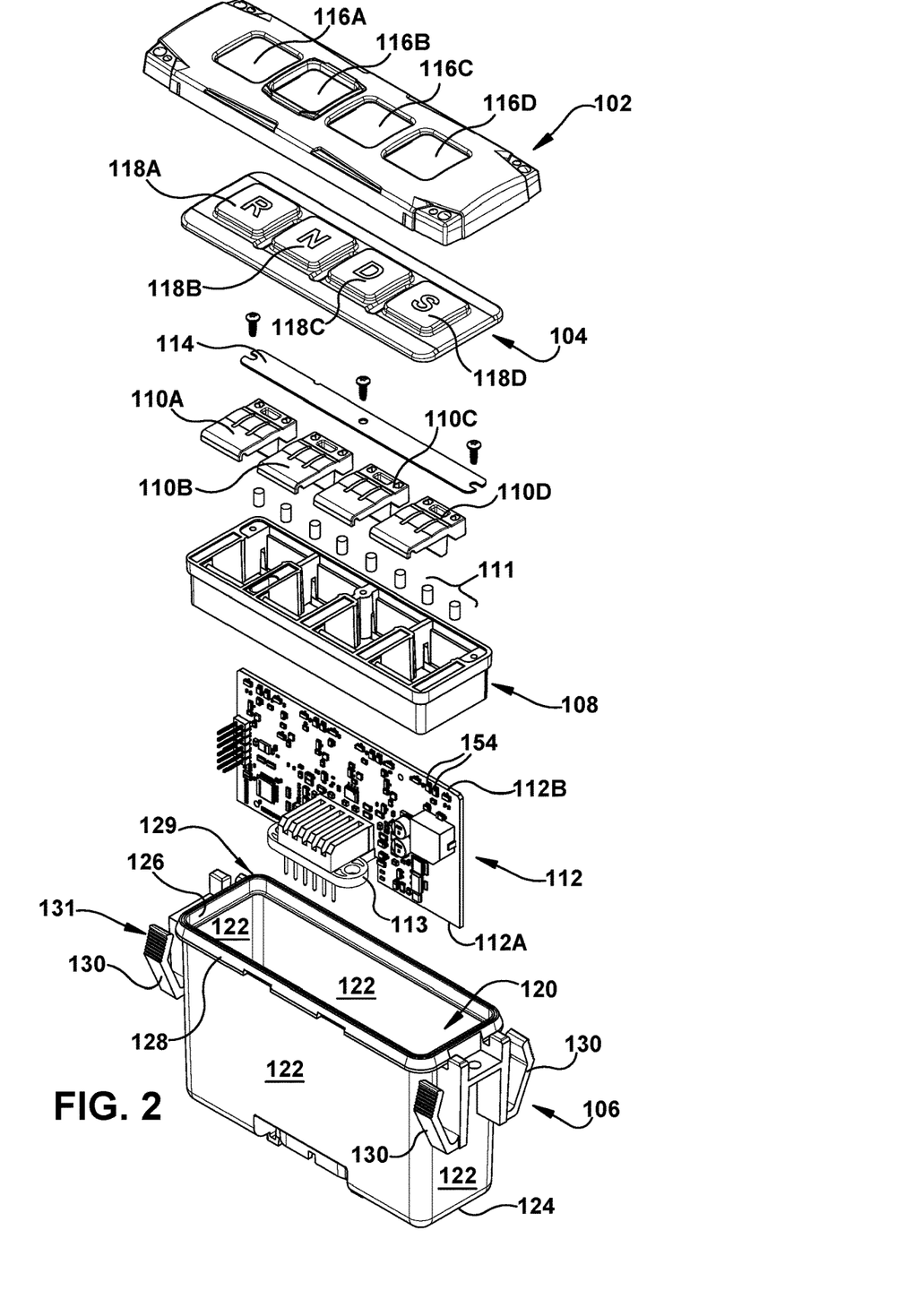
FIG. 2 is an exploded view of the push button switch assembly shown in FIG. 1.

With respect to FIG. 2, the push button switch assembly 100 is shown in an exploded view. As depicted, the push button switch assembly generally includes a faceplate 102, a keypad 104, a housing 106, a holder 108, a plurality of actuators 110A-D, a plurality of magnetic elements 111, a printed circuit board 112, and a plate 114, manufactured from a metallic material (e.g., steel, stainless steel, aluminum, etc.) which would be attracted to a magnet, or the like.

The faceplate 102 is in the shape of an elongated rectangle, having a plurality of apertures 116A-116D (i.e., through-holes) formed therein. Each of the apertures 116A-

116D is shown as being square shaped, however it is contemplated that the apertures 116A-116D may be shaped differently (e.g., circle, oval, triangle, etc.) and that each aperture 116A-116D may have a different shape than the others.

The keypad 104 comprises a plurality of elastic buttons 118A-118D formed therewith. Each of the elastic buttons 118A-118D is a square shaped convex dome that is formed integral with the other elastic buttons 118A-118D. That is, as shown in FIG. 2, the plurality of elastic buttons 118A-118D are formed integral such that they are made from the same material, during a simultaneous manufacturing process. However, it is contemplated that each of the elastic buttons 118A-118D may be separate elastic pieces with respect to one another. Further, each of the elastic buttons 118A-118D may have a different shape with respect to one another. Further, the elastic buttons 118A-118D are manufactured from a resilient material (e.g., silicone) such that each elastic button 118A-118D is elastically deformable between a first, unactuated position and a second, actuated position, as will be discussed further below.

Figure 6A:
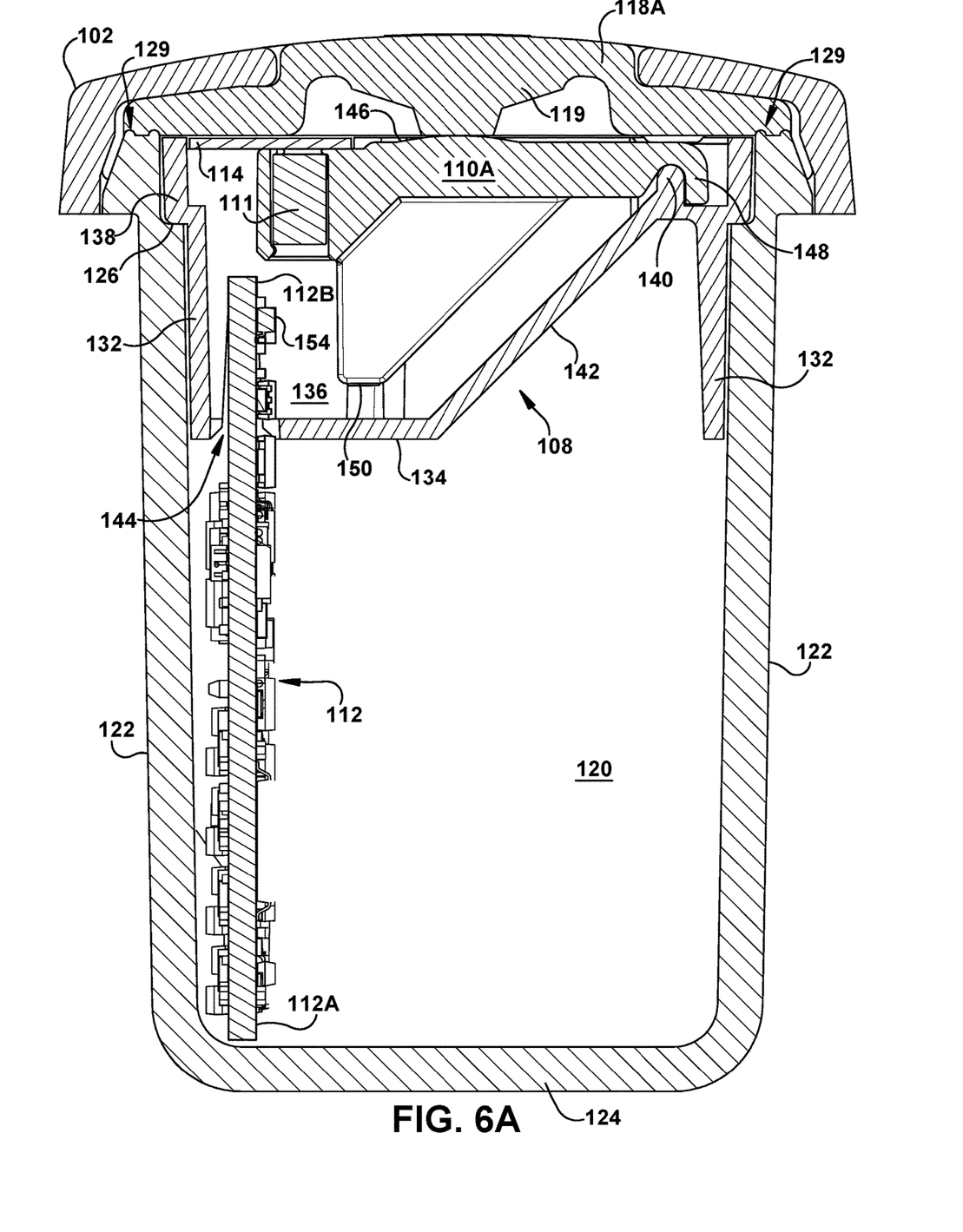
FIG. 6A is a cross-sectional view of the push button switch assembly along the line 6-6 in FIG. 1, wherein an elastic button is in a first, unactuated position.

Moreover, as best shown in FIG. 6A, which is a cross-sectional view of FIG. 1, taken along the line 6-6, each elastic button 118A-118D (specifically only one elastic button 118A being shown in FIG. 6A) includes an activation pin 119 (i.e., a protrusion) located on a lower surface thereof (i.e., a side opposite from one which a user will interact with). The activation pin 119 of each elastic button 118A-118D is formed integral therewith. However, it is contemplated that the activation pins 119 may be formed separately and subsequently attached to respective rear sides of the elastic buttons 118A-118D.

Moving back to FIG. 2, the housing 106 includes a plurality of walls that collectively define an inner space 120. Specifically, the housing 106 includes at least one side wall 122 and a bottom wall 124 (best shown in FIGS. 6A-6D, as will be discussed further below). The depicted embodiment of the push button switch assembly 100 shows the housing 106 with a rectangular shape wherein the housing 106 includes four side walls 122; however, it is to be understood that the housing 106 may have any shape with any number of side walls 122.

As shown, the side walls 122 of the housing 106 define an open top, however, it is to be understood that the side walls 122 need not define a completely open top. Moreover, the housing 106 includes an inner peripheral ledge 126 formed into at least one of the side walls 122. Specifically, the inner peripheral ledge 126 is formed adjacent the open top of the housing 106. While the depicted embodiment shows the inner peripheral ledge 126 formed only on two side walls 122 of the housing 106, it is to be understood that the inner peripheral ledge 126 in the depicted embodiment may be formed on all four side walls 122. It is further to be understood that the inner peripheral ledge 126 need only be formed on a single side wall 122. Further, the housing 106 includes an external peripheral flange 128 formed on the side walls 122 and extending outwards and away from the inner space 120 of the housing 106.

Figure 6B:
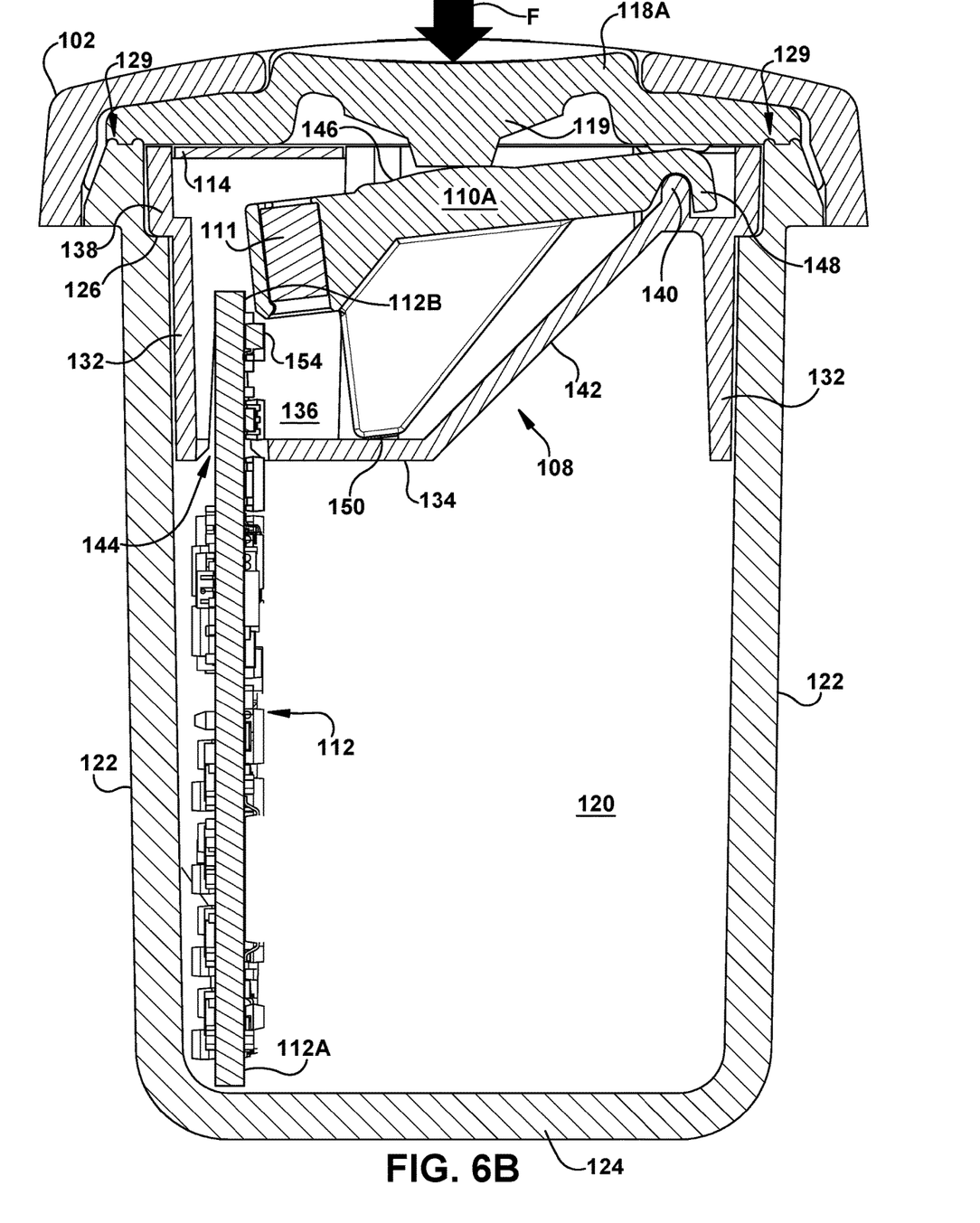
FIG. 6B is a partial, cross-sectional view of the push button switch assembly along the line 6-6 in FIG. 1, wherein the elastic button is in a second, actuated position.

Referring to FIGS. 6A-6B, at least one protrusion 129 extends from an upper peripheral edge of the side walls 122. The protrusion 129 extends peripherally around the open top of the housing 106. In the embodiment shown, two spaced-apart protrusions 129 are formed on the upper edge of the side walls 122.

Figure 3A:
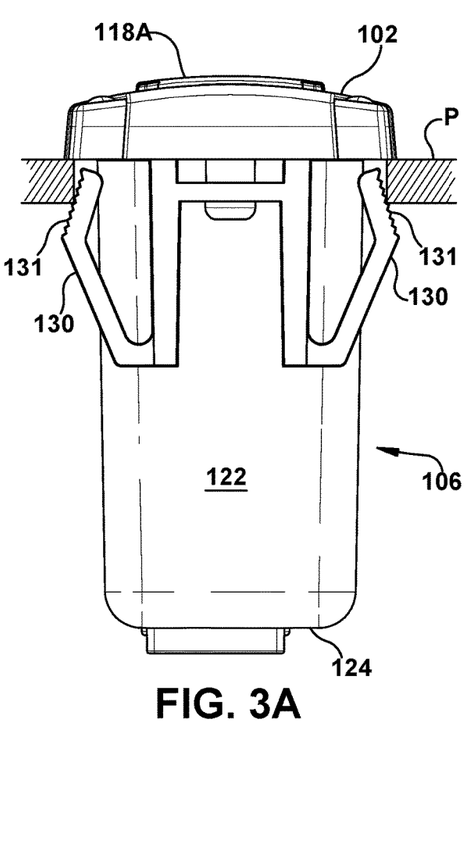
FIG. 3A is a side view of the push button switch assembly shown in FIG. 1, wherein the push button switch assembly is secured to one embodiment of a panel.

Referring back to FIG. 2, the housing 106 further includes elastic arms 130 disposed adjacent opposing side walls 122 thereof. Each of the elastic arms 130 has a side outward facing surface with a plurality of parallel elongated grooves 131 formed therein. As shown, each of the grooves 131 extends horizontally across its respective elastic arm 130 and the grooves 131 are spaced apart in a vertical direction. As best shown in FIG. 3A, the elastic arms 130 extend towards the external peripheral flange 128, but not all the way thereto. In this manner, a gap is formed between respective distal ends of the elastic arms 130 and the external peripheral flange 128. The elastic arms 130 may be formed integral with the housing 106 such that the elastic arms 130 and the housing 106 are formed as a single piece. However, it is further contemplated that the elastic arms 130 may be a separate and distinct element with respect to the housing 106 such that the elastic arms 130 are independently manufactured and subsequently affixed to the housing 106.

Figure 4:
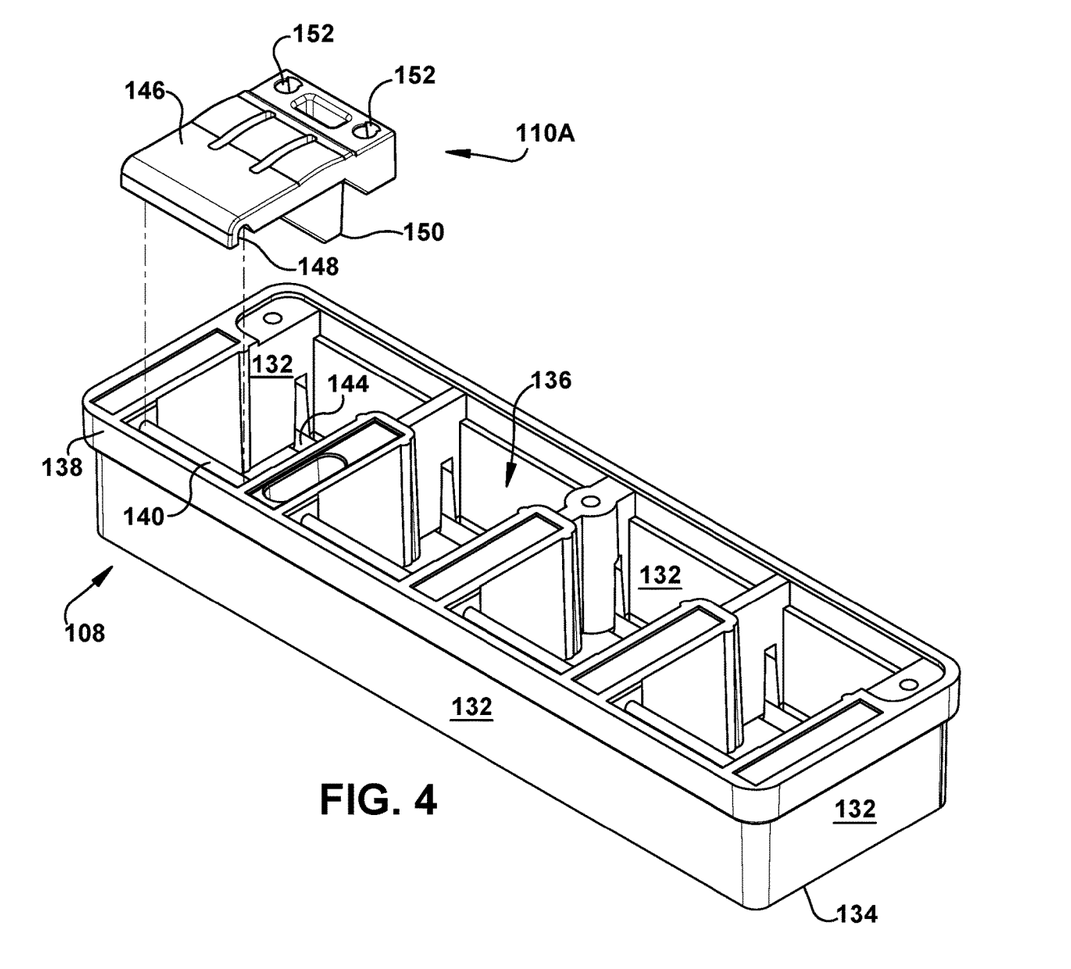
FIG. 4 is an enlarged perspective view of a holder and an actuator of the push button switch assembly shown in FIG. 1.

Moving back to FIG. 2, the holder 108 is shown as having a rectangular shape, however, it is further contemplated that the holder 108 may have any general shape. As best shown in FIG. 4, the holder 108 includes a plurality of side walls 132 and a bottom wall 134 that collectively define an inner space 136 of the holder 108. The inner space 136 of the holder 108 is partitioned into individual compartments; however, it is also contemplated that the inner space 136 need not be partitioned.

The holder 108 includes an external peripheral shoulder 138 formed on at least one side wall 132 of the plurality of side walls 132. Specifically, the external peripheral shoulder 138 in the depicted embodiment extends outwards from the plurality of side walls 132 in a direction away from the inner space 136 of the holder. Moreover, the external peripheral shoulder 138 is located at an end of the holder 108 opposite from the bottom wall 134 thereof. The holder 108 further includes a rail 140 (i.e., a protrusion) provided within the inner space 136 thereof and which extends away from the bottom wall 134 of the holder 108. The rail 140 extends at least partially between opposing side walls 132 of the holder 108 such that the rail 140 is located within each compartment. Specifically, the rail 140 may be a single piece extending continuously from one side wall 132 to the opposite side wall 132. Alternatively, as shown in FIG. 4, if the inner space 136 of the holder 108 is partitioned into separate compartments, then each compartment may include a single rail 140 therein.

Referring to FIG. 6A, the holder 108 includes an inclined wall 142 that connects the rail 140 to the bottom wall 134 of the holder 108. Moreover, a gap 144 is formed between the bottom wall 134 of the holder 108 and at least one of the side walls 132 of the holder 108. Simply put, the gap 144 forms an aperture (i.e., a through-hole) in the bottom wall 134 of the holder 108. It is to be understood that the plurality of side walls 132, the bottom wall 134 the rail 140, and the inclined wall 142 are all formed integral with one another. That is, these elements are all formed together as a single piece during a simultaneous manufacturing process (e.g., an injection molding process). However, it is contemplated that at least the rail 140 may be formed separate and distinct from the holder 116 and subsequently affixed thereto.

Moving back to FIG. 2, the plurality of actuators 110A-110D are all shown as comprising the same basic configuration. As such, for simplicity, the below disclosures will be made to only a single actuator 110A, unless otherwise specified. With respect to FIG. 4, the actuator 110A has a rectangular shaped body with a top surface 146 and a claw 148 formed at an end thereof. Specifically, the claw 148 is a U-shaped member whose indentation is formed on a bottom surface of the body. That is, the claw 148 is configured such that the indentation of the U-shaped member extends towards the top surface 146 of the body. However, it is contemplated that other configurations of the U-shaped member are possible. The actuator 110A further includes a foot 150 which extends outwards from the body in a direction opposite and away from the top surface 146. Although not shown, an elastic pad may be positioned on a surface of the foot 150 (e.g., a surface furthest away from the body of the actuator 110A). At an end of the body, opposite from the claw 148, the actuator 110A includes apertures 152 (i.e., through-holes) formed therein. In the depicted embodiment, the actuator 110A has two apertures 152, however, it is also contemplated that the actuator 110A may have only a single aperture 152, or even more than two apertures 152.

Moving back to FIG. 2, the magnetic elements 111 are all depicted as cylindrically-shaped magnets. However, it is contemplated that the magnetic elements 111 may have a different configuration (e.g., cube, sphere, etc.) and even that each magnetic element 111 may have a different configuration with respect to the other magnetic elements 111. As will be discussed further below, the number and configuration of magnetic elements 111 depends on the number and shape of the apertures 152 in the plurality of actuators 110A-110D.

The printed circuit board 112 is shown as having a flat, rectangular shape, generally corresponding with the dimensions of the inner space 120 of the housing 106. However, it is to be understood that the printed circuit board 112 may have any shape and/or any configuration commonly known in the art. The printed circuit board 112 includes a first end 112A and an opposite, second end 112B. A plurality of sensors 154 are provided on the printed circuit board 112 and may be linearly aligned thereon, but such an alignment is not required. That is, the sensors 154 are electrically connected on and to the printed circuit board 112 at the second end 112B thereof. As will be discussed further below, the sensors 154 are configured to detect movement of the plurality of actuators 110A-110D, and more specifically, each sensor 154 can be a hall sensor that senses a magnetic field or a change in a magnetic field generated by the magnetic elements 111. Further, an electrical connector 113 is disposed adjacent (e.g., secured to) the printed circuit board 112 and permits an electrical connection between the printed circuit board 112 and an external source (e.g., a control processing unit of the vehicle) in order to transmit signals therebetween. For simplicity, the electrical connector 113 is omitted from FIGS. 6A-6B.

During assembly, the printed circuit board 112 is inserted into the inner space 120 of the housing 106. Specifically, the printed circuit board 112 is inserted such that the first end 112A of the printed circuit board 112 is disposed adjacent the bottom wall 124 of the housing 106. In the depicted embodiment shown in FIG. 6A, the first end 112A of the printed circuit board 112 does not physically contact the bottom wall 124 of the housing 106. However, it is contemplated that the printed circuit board 112 may contact the bottom wall 124 of the housing 106.

Each of the magnetic elements 111 is secured to a specific actuator of the plurality of actuators 110A-110D. Specifically, each magnetic element 111 is inserted into a designated aperture 152 and is held therein via conventional means (e.g., press-fit, adhesives, etc.). Alternatively, each of the actuators 110A-110D may be formed or molded around a pair of magnetic elements 111 such that the actuators 110A-110D are formed and the magnetic elements 111 are respectively secured thereto during a simultaneous manufacturing process. In the depicted embodiment, each of the magnetic elements 111 is at least partially surrounded by its respective actuator 110A-110D. That is, a circumferential side surface of each of the magnetic elements 111 is surrounded by its respective actuator 110A-110D whereas top and bottom surfaces of the magnetic elements 111 are exposed. However, it is contemplated that the top and bottom surfaces of the magnetic elements 111 need not be exposed.

Each of the actuators 110A-110D is positioned within the inner space 136 of the holder 108. Specifically, as shown in FIG. 2, each of the actuators 110A-110D has a designated compartment. As shown in FIG. 4, the actuator 110A is first aligned with its compartment such that the claw 148 is positioned above the rail 140 of the holder 108. The actuator 110A is then inserted into the compartment, as shown in FIG. 6A, such that the claw 148 engages (e.g., partially surrounds) an upper portion of the rail 140 in order to permit the actuator 110A to pivot with respect to the holder 108 between first and second positions, as will be further discussed below. Further, in the installed position, the foot 150 of the actuator 110A is positioned adjacent the bottom wall 134 of the holder 108.

After the actuators 110A-110D are positioned within the inner space 136 of the holder 108, the plate 114 is secured to the holder 108 at a side of the holder 108 opposite from the bottom wall 134 thereof. Specifically, the plate 114 is positioned above the actuators 110A-110D, and more specifically, is disposed adjacent the magnetic element(s) 111 in each of the actuators 110A-110D.

The holder 108 may be positioned in the inner space 120 of the housing 106. Specifically, the external peripheral shoulder 138 of the holder 108 engages with (i.e., rests on) the inner peripheral ledge 126 of the housing 106. Moreover, as the holder 108 is inserted into the inner space 120 of the housing 106, the second end 112B of the printed circuit board 112 is inserted into the gap 144 formed in the holder 108. As is best shown in FIG. 6A, in an installed position, the first end 112A of the printed circuit board 112 is disposed within the inner space 120 of the housing 106 (i.e., at a location outside of the inner space 136 of the holder 108) and the second end 112B of the printed circuit board 112 is located within the inner space 136 of the holder 108. More specifically, the sensors 154 are located within the inner space 136 of the holder 108 and are positioned closest to the end of the actuators 110A-110D which includes the magnetic elements 111. It is to be noted that the embodiment shown in FIG. 2 includes an equal amount of sensors 154 and magnetic elements 111. Thus, each magnetic element 111 is associated with a designated sensor 154. However, it is further contemplated that the number of sensors 154 and the number of magnetic elements 111 need not be the same. For example, a pair of magnetic elements 111 (i.e., in a single actuator, for example, actuator 110A) can share only one sensor 154.

Figure 5:
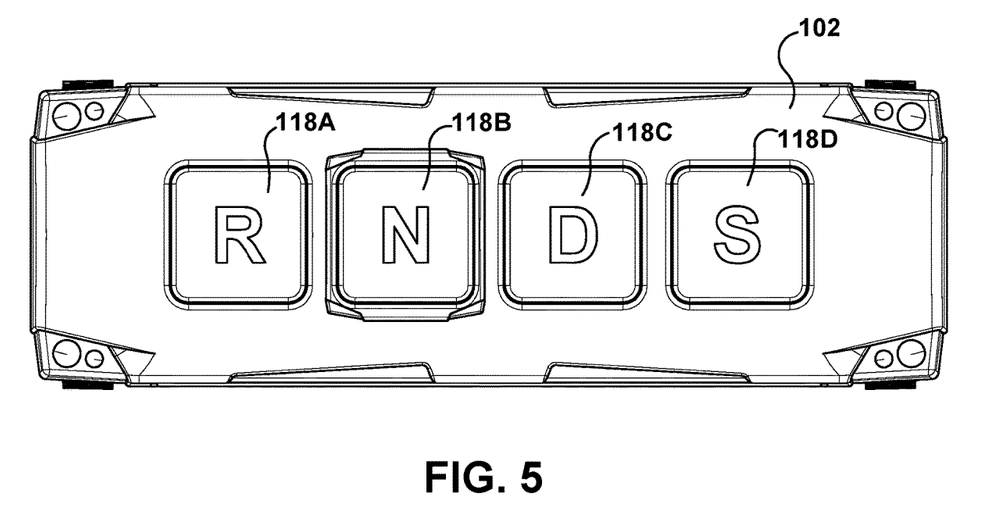
FIG. 5 is top view of the push button switch assembly shown in FIG. 1.

As is best shown in FIG. 5, the faceplate 102 and the keypad 104 are positioned with respect to one another such that each of the elastic buttons 118A-118D is inserted into a designated aperture 116A-116D formed in the faceplate 102. Moreover, the keypad 104 may be secured to the faceplate 102 by conventional means, such as adhesives, screws, or the like. The faceplate 102 and keypad 104 are then positioned over the open top of the housing 106 and secured thereto so as to close the inner space 120 of the housing 106. The faceplate 102 and keypad 104 may be secured to the housing 106 via a snap-fit configuration, or even by screws, adhesives, or the like. Moreover, the faceplate 102 and keypad 104 are positioned relative to the housing 106 in the installed position such that each elastic button 118A-118D is associated with a designated actuator 110A-110D. Further-more, as shown in FIGS. 6A-6B, when the faceplate 102 and keypad 104 are secured to the housing 106, the protrusion 129 positioned at the upper edge of the side walls 122 engage the keypad 104 and elastically deforms the surrounding areas thereof. In this manner, a seal is provided between keypad 104 and the housing 106 which hinders ingress of contaminants.

As shown in FIG. 3A, the push button switch assembly 100 is installed on a panel P (e.g., a dashboard) of a vehicle. Specifically, during installation, the housing 106 is inserted into an aperture formed in the panel P such that the bottom wall 124 of the housing 106 first enters the aperture. As the housing 106 is further inserted, the panel P engages with the elastic arms 130 and elastically deforms (i.e., bends) them such that continued insertion is permitted. The housing 106 is further inserted until the external peripheral flange 128 of the housing 106 is seated against (i.e., contacts) the panel P. In this position, a bottom surface of the panel P engages one of the grooves 131 disposed on the elastic arm 130. Due to the resilient nature of the elastic arms 130, the panel P is locked in place such that the push button switch assembly 100 is secured to the vehicle. In other words, the plurality of grooves 131 creates a ratchet-type of feature wherein the push button switch assembly 100 is adjustable with respect to a surface on which it is to be secured to (i.e., the panel P). That is, the push button switch assembly 100 may be secured to a variety of panels P of different thickness.

Figure 3B:
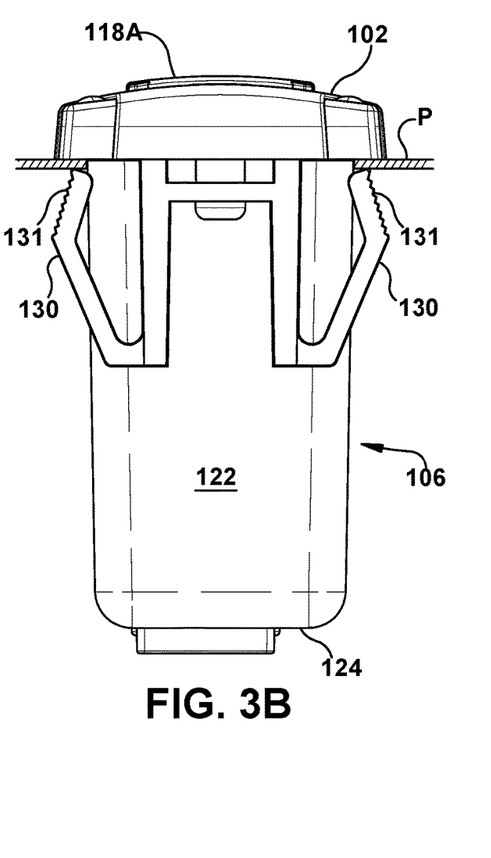
FIG. 3B is a side view of the push button switch assembly shown in FIG. 1, wherein the push button switch assembly is secured to another embodiment of a panel.

In an alternative embodiment, as shown in FIG. 3B, if the panel P is dimensioned such that it can fit within the gap provided between the external peripheral flange 128 of the housing 106 and the respective distal ends of the elastic arms 130, then the plurality of grooves 131 need not be engaged. Specifically, when the panel P is positioned within the gap, the elastic arms 130 spring back to their original shape, such that the panel P is captured between the distal ends of the elastic arms 130 and the external peripheral flange 128 of the housing 106. The push button switch assembly 100 is thereby secured to the vehicle. It is to be understood that the faceplate 102 and keypad 104 need not be attached to the housing 106 in order to secure the housing 106 to the vehicle. That is, the housing 106 can initially be secured to the vehicle and then the faceplate 102 and keypad 104 can be subsequently attached to the housing 106.

It is to be understood that the foregoing steps of assembling the push button switch assembly 100 are not required to be completed in the order discussed above. That is, it is contemplated that the elements of the push button switch assembly 100 may be assembled in an order different from that discussed above.

The push button switch assembly 100 will now be described with respect to operation of the same. Each of the elastic buttons 118A-118D is configured to be depressed (i.e., actuated) by a user. That is, each of the elastic buttons 118A-118D is moveable between a first, unactuated position (as shown in FIG. 6A) and a second, actuated position (as shown in FIG. 6B). Moving one of the elastic buttons 118A-118D from the first, unactuated position to the second, actuated position places the vehicle in a specific operating mode. For example, the elastic button 118A may place a motor vehicle in a reverse mode, the elastic button 118B may place the vehicle in a neutral mode, the elastic button 118C may place the vehicle in a drive mode, and the elastic button 118D may place the vehicle in special mode. It is to be understood that the elastic buttons 118A-118D may be associated with a function other than placing the vehicle in a specific operating mode. That is, the elastic buttons 118A-118D may be directed towards in-cabin functionality or any other function associated with the vehicle. For simplicity, unless otherwise stated, the below disclosure is made with respect to only a single elastic button 118A, a single actuator 110A, a single magnetic element 111 and a single sensor 154.

With respect to FIG. 6A, the elastic button 118A is shown in the first, unactuated position. When the elastic button 118A is in the first, unactuated position, the actuator 110A is biased into the first position via the magnetic element 111. That is, a magnetic attraction exists between the magnetic element 111 in the actuator 110A and the plate 114; this magnetic attraction results in the magnetic element 111 biasing the actuator 110A into the first position. As further shown, when the elastic button 118A is in the first, unactuated position, the activation pin 119 contacts the top surface 146 of the actuator 110A, and the magnetic element 111 is positioned closer to the plate 114 than when the actuator 110A is in the second positon (as will be detailed below with reference to FIG. 6B). However, it is contemplated that the activation pin 119 need not contact the top surface of the actuator 110A when the elastic button 118A is in the first, unactuated position and when the actuator 110A is in the first position.

Moreover, in the first position, the actuator 110A contacts the plate 114. That is, the top surface 146 of the actuator 110A physically contacts a bottom surface of the plate 114. However, it is further contemplated that separate elements may be disposed between the actuator 110A and the plate 114 such that the actuator 110A is still magnetically biased into the first position, but does not physically contact the plate 114 in the first position. Further, in the first position, the foot 150 of the actuator 110A is spaced from the bottom wall 134 of the holder 108.

Turning now to FIG. 6B, when a user wishes to select the function associated with the elastic button 118A, the user applies a force F to (e.g., presses) the elastic button 118A in a direction towards the inner space 120 of the housing 106. Specifically, the force F must be great enough to overcome an initial, maximum force generated via the magnetic attraction between the magnetic element 111 and the plate 114. As the force F is applied, the elastic button 118A elastically deforms and transitions from the first, unactuated position to the second, actuated position. As the elastic button 118A moves from the first, unactuated position to the second, actuated position, the force F is transmitted to the actuator 110A. Specifically, the activation pin 119 of the elastic button 118A transmits the force F to the actuator 110A, which causes the actuator 110A to break contact with the plate 114 and pivot (about the rail 140) to the second position.

Figure 7:
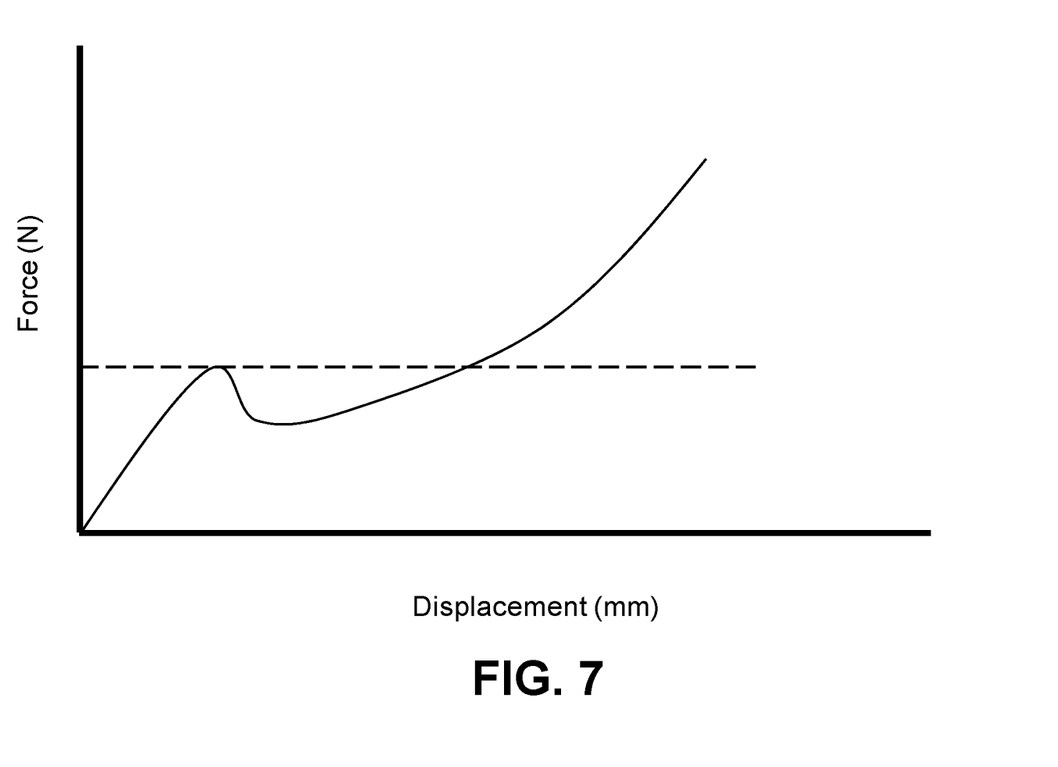
FIG. 7 is a graph depicting a force applied to an elastic button of the push button switch assembly shown in FIG. 1.

As briefly mentioned above, the applied force F must be great enough to overcome the initial, maximum force of the magnetic attraction. This initial, maximum force occurs when the actuator 110A is in the first position. That is, the initial, maximum force of the magnetic attraction occurs when the actuator 110A contacts the plate 114 (i.e., when the distance between the magnetic element 111 and the plate 114 is the smallest). The sudden overcoming of the initial, maximum force generated via the magnetic attraction provides a tactile haptic response to the elastic button 118A which, in turn, is imparted to the user. In this manner, the user is made aware that the function associated with the elastic button 118A has been selected and will begin operation. This phenomena is best explained with reference to FIG. 7, which graphically depicts the force F being applied to the elastic button 118A (i.e., via the user depressing the elastic button 118A) verses displacement of the elastic button 118A. As shown, the force F applied to the elastic button 118A increases unit it reaches the initial, maximum force of the magnetic attraction (graphically represented by a horizontal, dashed line) between the magnetic element 111 and the plate 114. When the force F meets or exceeds the initial, maximum force of the magnetic attraction, the actuator 110A suddenly begins to move away from the first position. As noted above, it is this sudden overcoming of the initial, maximum force generated via the magnetic attraction that provides the tactile haptic response to the elastic button 118A which, in turn, is imparted to the user. As the distance between the actuator 110A and the plate 114 increases, the magnetic attraction decreases, and thus the force F applied to the elastic button 118A briefly decreases. Thereafter, due to the resilient nature of the elastic button 118A, the force F applied thereto once again increases until the actuator 110A reaches the second position (e.g., when the foot 150 of the actuator 110A contacts the bottom wall 134 of the holder 108 as shown in FIG. 6B, to be further discussed below).

Of note, the strength of the tactile haptic response provided to the elastic button 118A is dependent on the strength of the magnetic element 111 and/or on the number of magnetic elements 111 contained within the actuator 110A. Accordingly, to enhance functionality of the push button switch assembly 100, each of the elastic buttons 118A of the push button switch assembly 100 may impart a tactile haptic response of a different strength. As such, the user may readily know, based on the strength of the tactile haptic response provided by the elastic button 118A, if the elastic button 118A intended to be actuated was indeed actuated. Alternatively, each of the elastic buttons 118A may impart the same strength tactile haptic response.

As the actuator 110A pivots away from the first position, the sensor 154 senses a change in the magnetic field of the magnetic element 111. This change in the magnetic field is indicative of the user actuating the elastic button 118A so as to select the function associated with the elastic button 118A. Thus, when the change in the magnetic field is sensed, a signal may be sent to a controller (not shown) which, in turn, oversees activation of the intended function. Of note, the configuration and positioning of the plate 114 prevents stray magnetic fields from entering the inner space 136 of the holder 108 and being sensed by the sensor 154. Said differently, the plate 114 shields the sensor 154 from stray magnetic fields, thus preventing inadvertent actuation.

As further shown in FIG. 6B, when the actuator 110A is in the second position, the magnetic element 111 is disposed adjacent to the sensor 154 and the foot 150 of the actuator 110A contacts the bottom wall 134 of the holder 108, thereby disallowing further pivotal movement in that direction. After the user receives the tactile haptic response imparted by the elastic button 118A, the user may disengage the elastic button 118A such that the force F is no longer applied thereto. Due to the biasing of the magnetic element 111, and because there is no external force acting against the biasing of the magnetic element 111, the actuator 110A pivots back towards the first position (via the magnetic attraction between the magnetic element 111 and the plate 114), and the elastic button 118A transitions back to the first, unactuated position.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. A push button switch assembly for a vehicle, the push button switch assembly comprising:
    an elastic button moveable between a first unactuated position and a second actuated position;
    a plate;
    a housing defining an inner space;
    a holder disposed in the inner space and including a rail formed integral therewith, the rail being a protrusion that projects outwards and away from a wall of the holder;
    an actuator disposed within the inner space, provided adjacent the plate, and pivotable between a first position and a second position, the actuator including a magnetic element wherein when the actuator is in the first position the magnetic element is closer to the plate than when the actuator is in the second position; and
    a hall sensor configured to sense a magnetic field of the magnetic element,
    wherein the rail defines an axis about which the actuator pivots, wherein the actuator engages the rail so as to pivot between the first and second positions, and wherein the actuator comprises a claw that partially surrounds an upper portion of the rail to permit the actuator to pivot about the axis,
    wherein when the elastic button is in the first unactuated position the magnetic element biases the actuator into the first position via a magnetic attraction between the magnetic element and the plate, and when the elastic button is moved to the second actuated position, a force applied to the elastic button is transmitted to the actuator such that said force overcomes the magnetic attraction and permits the actuator to pivot to the second position while providing a tactile haptic response, and
    wherein when the actuator is moved to the second position, the hall sensor senses a change in the magnetic field of the magnetic element.

2. The push button switch assembly of claim 1, the magnetic element being positioned at an end of the actuator that is distal from the claw.

3. A push button switch assembly for a vehicle, the push button switch assembly comprising:
    an elastic button moveable between a first unactuated position and a second actuated position;
    a plate;
    a housing defining an inner space;
    a holder disposed in the inner space and including a rail formed integral therewith;
    an actuator disposed within the inner space, provided adjacent the plate, and pivotable between a first position and a second position, the actuator including a magnetic element wherein when the actuator is in the first position the magnetic element is closer to the plate than when the actuator is in the second position; and
    a hall sensor configured to sense a magnetic field of the magnetic element,
    wherein the rail defines an axis about which the actuator pivots, wherein the actuator engages the rail so as to pivot between the first and second positions, and wherein the actuator comprises a claw that partially surrounds an upper portion of the rail to permit the actuator to pivot about the axis,
    wherein when the elastic button is in the first unactuated position the magnetic element biases the actuator into the first position via a magnetic attraction between the magnetic element and the plate, and when the elastic button is moved to the second actuated position, a force applied to the elastic button is transmitted to the actuator such that said force overcomes the magnetic attraction and permits the actuator to pivot to the second position while providing a tactile haptic response, wherein when the actuator is moved to the second position, the hall sensor senses a change in the magnetic field of the magnetic element, and wherein the housing further comprises an inner peripheral ledge formed on a side wall of the housing and the holder comprising an external peripheral shoulder extending away from at least one side wall of the holder, the external peripheral shoulder of the holder engaging the inner peripheral ledge of the housing when the holder is disposed in the housing.

4. The push button switch assembly of claim 1, the actuator further comprising a foot, wherein when the actuator is in the first position, the foot is spaced from a bottom wall of the holder, and when the actuator is in the second position, the foot contacts the bottom wall of the holder.

5. The push button switch assembly of claim 1, further comprising a faceplate that closes the inner space of the housing, the faceplate including an aperture formed therein, and the elastic button being located within the aperture.

6. The push button switch assembly of claim 1, further comprising a printed circuit board, wherein the hall sensor is provided on the printed circuit board.

7. The push button switch assembly of claim 1, the elastic button comprising a protrusion that extends toward the actuator for transmitting the force applied to the elastic button to the actuator.

8. The push button switch assembly of claim 7, the protrusion being cone-shaped in cross-section.

9. The push button switch assembly of claim 1, wherein in the first position, the actuator contacts the plate, and in the second position, the actuator does not contact the plate.

10. A push button switch assembly for a vehicle, the push button switch assembly comprising:
  a housing defining an inner space;
  a holder disposed in the inner space and including a rail formed integral therewith, the rail being a protrusion that projects outwards and away from a wall of the holder;
  an actuator disposed within the inner space and pivotable between a first position and a second position, the actuator including a magnetic element;
  a metallic element positioned adjacent the actuator, wherein the actuator is biased into the first position via a magnetic attraction between the magnetic element and the metallic element, and wherein when the actuator is in the first position the magnetic element is closer to the metallic element than when the actuator is in the second position; and
  a hall sensor configured to sense a magnetic field of the magnetic element,
  wherein the rail defines an axis about which the actuator pivots, wherein the actuator engages the rail so as to pivot between the first and second positions, and wherein the actuator comprises a claw that partially surrounds an upper portion of the rail to permit the actuator to pivot about the axis, and
  wherein when a force applied to the actuator meets or exceeds an initial, maximum force of the magnetic attraction, the actuator pivots towards the second position and provides a tactile haptic response, and wherein when the actuator pivots towards the second position, the hall sensor senses a change in the magnetic field of the magnetic element.

11. The push button switch assembly of claim 10, further comprising a printed circuit board having the hall sensor positioned thereon.

12. The push button switch assembly of claim 10, the actuator further comprising a foot, wherein when the actuator is in the first position, the foot is spaced from a bottom wall of the holder, and when the actuator is in the second position, the foot contacts the bottom wall of the holder.

13. The push button switch assembly of claim 10, wherein the metallic element is a plate, and wherein in the first position, the actuator contacts the plate, and in the second position, the actuator does not contact the plate.

14. The push button switch assembly of claim 10, the magnetic element being at least partially surrounded by the actuator.

15. The push button switch assembly of claim 10, further comprising an elastic button moveable between a first unactuated position and a second actuated position and including a protrusion that extends toward the actuator, wherein when the elastic button is moved to the second actuated position, the force is applied to the actuator via the protrusion.

16. The push button switch assembly of claim 15, the protrusion being cone-shaped in cross-section.

* * * * *